United States Patent
Ko et al.

(10) Patent No.: US 11,437,169 B2
(45) Date of Patent: Sep. 6, 2022

(54) HIGH-TEMPERATURE SUPER CONDUCTING WIRE

(71) Applicant: Korea Electrotechnology Research Institute, Changwon-si (KR)

(72) Inventors: Rock Kil Ko, Changwon-si (KR); Dong Woo Ha, Changwon-si (KR); Seog Whan Kim, Changwon-si (KR); Young Sik Jo, Jinju-si (KR)

(73) Assignee: Korea Electrotechnology Research Institute, Changwon-si (KR)

( * ) Notice: Subject to any disclaimer, the term of this patent is extended or adjusted under 35 U.S.C. 154(b) by 1220 days.

(21) Appl. No.: 15/757,707

(22) PCT Filed: Sep. 6, 2016

(86) PCT No.: PCT/KR2016/009951
§ 371 (c)(1),
(2) Date: Mar. 6, 2018

(87) PCT Pub. No.: WO2017/043833
PCT Pub. Date: Mar. 16, 2017

(65) Prior Publication Data
US 2019/0043644 A1   Feb. 7, 2019

(30) Foreign Application Priority Data
Sep. 9, 2015   (KR) .................. 10-2015-0127517

(51) Int. Cl.
*H01B 1/02*   (2006.01)
*H01B 12/06*   (2006.01)
*H01L 39/08*   (2006.01)

(52) U.S. Cl.
CPC ............... *H01B 12/06* (2013.01); *H01B 1/02* (2013.01); *H01L 39/08* (2013.01); *Y02E 40/60* (2013.01)

(58) Field of Classification Search
CPC ............ H01B 1/02; H01B 12/06; H01L 39/08
(Continued)

(56) References Cited

U.S. PATENT DOCUMENTS 8,470,744 B2   6/2013   Allais et al.
8,569,212 B2   10/2013  Ha et al.
(Continued)

FOREIGN PATENT DOCUMENTS

EP   0498420   *   8/1992
JP   2010192116 A   9/2010
(Continued)

*Primary Examiner* — Mark Kopec
(74) *Attorney, Agent, or Firm* — The Webb Law Firm

(57) ABSTRACT

The present invention relates to a stacking structure of a superconducting wire. The present invention provides a superconducting wire in which a metal substrate, a buffer layer, a superconducting layer, and a stabilizing layer are stacked, the superconducting wire including: a plurality of wedges which penetrates through the superconducting layer and the buffer layer to connect the stabilizing layer and the metal substrate. According to the present invention, it is possible to provide the superconducting wire of which mechanical strength is improved to have high resistance against to deterioration or delamination. Further, the present invention may provide the superconducting wire which is self-protectable against a quench phenomenon. Further, the present invention may provide the superconducting wire which is suitable for application of a high magnetic field.

8 Claims, 11 Drawing Sheets

(58) Field of Classification Search
USPC .............................. 505/237, 238; 174/125.1
See application file for complete search history.

(56) References Cited

U.S. PATENT DOCUMENTS

| | | | |
|---|---|---|---|
| 10,319,500 B2* | 6/2019 | Ko ........................... | B23K 1/19 |
| 2007/0232500 A1 | 10/2007 | Selvamanickam et al. | |
| 2010/0210468 A1* | 8/2010 | Lee ......................... | H01L 39/02 |
| | | | 505/410 |
| 2012/0015817 A1* | 1/2012 | Allais ..................... | H01L 39/16 |
| | | | 505/237 |
| 2015/0357089 A1* | 12/2015 | Oh ......................... | H01B 12/06 |
| | | | 505/237 |
| 2016/0155543 A1 | 6/2016 | Ko et al. | |
| 2017/0011824 A1* | 1/2017 | Yamaguchi ........... | H01L 39/248 |

FOREIGN PATENT DOCUMENTS

| | | |
|---|---|---|
| JP | 201140378 A | 2/2011 |
| JP | 20134457 A | 1/2013 |
| KR | 100993246 B1 | 11/2010 |
| KR | 10201110017348 A | 2/2011 |
| KR | 1020110099460 A | 9/2011 |
| KR | 1020150002100 A | 1/2015 |
| WO | 2014208843 A1 | 12/2014 |

\* cited by examiner

300

400

HIGH-TEMPERATURE SUPER CONDUCTING WIRE

CROSS-REFERENCE TO RELATED APPLICATIONS

This application is the United States national phase of International Application No. PCT/KR2016/009951 filed Sep. 6, 2016, and claims priority to Korean Patent Application No. 10-2015-0127517 filed Sep. 9, 2015, the disclosures of which are hereby incorporated in their entirety by reference.

TECHNICAL FIELD

The present invention relates to a superconducting wire, and more particularly, to a stacking structure of a high-temperature superconducting wire.

BACKGROUND ART

A high-temperature superconducting wire operating at a liquefied nitrogen temperature exhibits a high critical current density characteristic at a high magnetic field and attracts attention as application of a high magnetic field of a superconducting magnet and the like.

The superconducting wire has a structure in which a substrate, a buffer layer, a superconducting layer, and a stabilizing layer are stacked, and among them, the buffer layer and the superconducting layer are formed of a ceramic material and is vulnerable to mechanical stress, so that the superconducting wire has a disadvantage in that deterioration, such as damage to the superconducting layer and separation of the wire stacking structure, is easily generated in a work environment, such as coil winding or quenching.

In the meantime, it is known that a high-temperature superconducting wire has a higher thermal capacity and a higher critical temperature than those of a low-temperature superconducting wire, so that it is less likely to generate quenching, but actually, a quench propagation speed is low, so that there is a problem in that it is difficult to detect a quench phenomenon from the outside. Accordingly, the high-temperature superconducting wire in the related art has a fatal defect in that the wire is burned out by a local quench phenomenon.

In order to solve the problem, various technologies for detecting deterioration of the wire or a quench phenomenon and protecting the wire from the deterioration of the wire and the quench phenomenon have been developed, but there has been no fundamental solution up to now.

DISCLOSURE

Technical Problem

In order to solve the problems in the related art, an object of the present invention is to provide a superconducting wire which is capable of improving mechanical strength of the superconducting wire.

Another object of the present invention is to provide a superconducting wire having large resistance against deterioration during an operation, such as wire winding.

Another object of the present invention provides a superconducting wire which is self-protectable against a quench phenomenon.

Another object of the present invention is to provide a superconducting wire which is suitable for application of a high magnetic field.

Technical Solution

An exemplary embodiment of the present invention provides a superconducting wire in which a metal substrate, a buffer layer, a superconducting layer, and a stabilizing layer are stacked, the superconducting wire including: a plurality of wedges which penetrates through the superconducting layer and the buffer layer to connect the stabilizing layer and the metal substrate.

In the exemplary embodiment, the plurality of wedges may be arranged in a longitudinal direction of the superconducting wire in a row. In this case, the plurality of wedges may be arranged in a longitudinal direction of the superconducting wire in at least two rows.

Further, the plurality of wedges may mechanically connect the stabilizing layer and the metal substrate. Further, the plurality of wedges may electrically connect the superconducting layer with the metal substrate or the stabilizing layer. Further, the plurality of wedges may thermally connect the superconducting layer with the buffer layer, and the superconducting layer with the metal substrate.

In the exemplary embodiment, at least some of the plurality of wedges may include a conductive metal. Further, at least some of the plurality of wedges may also include a magnetic substance.

In the exemplary embodiment, at least some of the plurality of wedges may penetrate through the metal substrate. Further, at least some of the plurality of wedges may penetrate through the stabilizing layer.

Further, according to another exemplary embodiment of the present invention, at least some of the plurality of wedges may be implemented as a part of the stabilizing layer.

According to the exemplary embodiment of the present invention, a lamination substrate may be stacked on any one of the metal substrate and the stabilizing layer of the superconducting wire.

Another exemplary embodiment of the present invention provides a superconducting wire including a superconducting layer and a conductive metal layer surrounding the superconducting layer, the superconducting wire including: a plurality of wedges which penetrates through the superconducting layer to connect the conductive metal layers above and below the superconducting layer.

In this case, the superconducting wire may further include a buffer layer between the superconducting layer and the conductive metal layer, in which the plurality of wedges may penetrate through the superconducting layer and the buffer layer to connect the conductive metal layers.

Advantageous Effects

According to the present invention, it is possible to provide the superconducting wire of which mechanical strength is improved to have high resistance to deterioration or delamination. Further, the present invention may provide the superconducting wire which is self-protectable against a quench phenomenon. Further, the present invention may provide the superconducting wire which is suitable for application of a high magnetic field.

Further, the superconducting wire according to the present invention shows an effect shown when the superconducting layer is formed of a multi-filament, so that it is possible to obtain effects in that AC loss is decreased and a decrease in a magnetic field due to a screen current is decreased when a superconducting coil is manufactured.

BEST MODE

Hereinafter, the present invention will be described.

Figure 1:
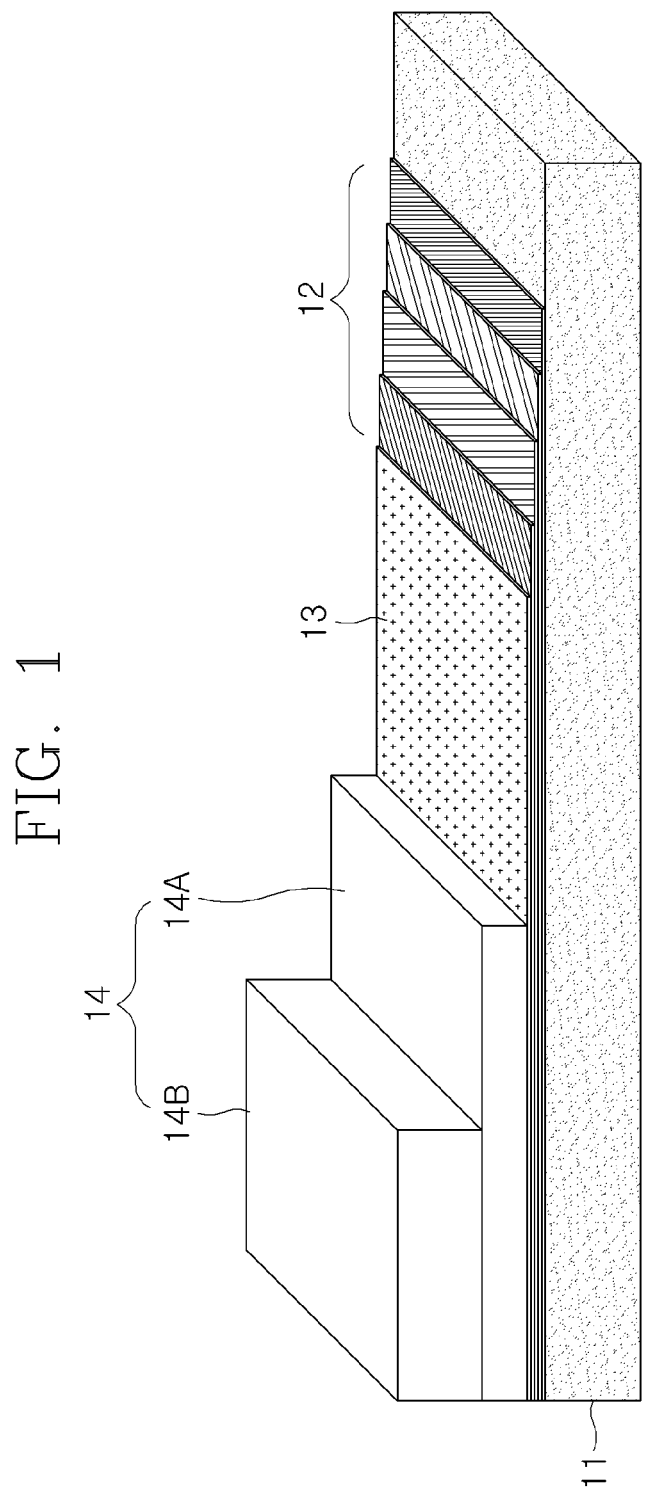
FIG. 1 is a diagram illustrating an example of a stacking structure of a typical superconducting wire.

FIG. 1 is a diagram illustrating an example of a stacking structure of a typical second-generation superconducting wire.

Referring to FIG. 1, the superconducting wire includes a metal substrate 11, a series of buffer layers 12, a superconducting layer 13, a capping layer 14A, and a stabilizing layer 14B.

Herein, both the capping layer 14A and the stabilizing layer 14B are formed of conductive metal layers, and for example, the capping layer 14A may be formed of a precious metal, such as silver and gold, and the stabilizing layer 14B may be formed of copper or an alloy thereof. In contrast, the capping layer 14A and the stabilizing layer 14B may also be formed as one conductive metal layer as a matter of course. Hereinafter, in the specification of the present invention, the conductive metal layers 14A and 14B are illustrated as one stabilizing layer.

In the present invention, as long as a material of the superconducting layer is formed into a thin film in the form of a sheet, the material is not particularly limited. For example, an iron-based superconductor, as well as a high-temperature superconducting material, such as a YBCO (Y—Ba—Cu—O)-based material, a Bi—Sr—Ca—Cu—O (BSCCO)-based material, such as Bi2Sr2CaCu2O8 (Bi-2212) and Bi2Sr2Ca2Cu3O10 (Bi-2223), a Tl—Ca—Ba—Cu—O (TCBCO)-based material, and a Hg—Ba—Ca—Cu—O (HBCCO)-based material, may be used as the superconducting layer.

In the wire of FIG. 1, the metal substrate formed of the material, such as nickel or a nickel alloy, occupies most of a thickness of the superconducting wire. For example, the metal substrate has a thickness of about 70 to 100 µm and the stabilizing layer has a thickness of several tens of µm, but a thickness of each of the buffer layer and the superconducting layer is just several µm. Accordingly, a thickness of each layer of the drawings of FIG. 1 and the subsequent drawings is not illustrated according to an actual accumulation rate but is exaggerated and illustrated for visual recognition. Further, the present invention has been described based on the second-generation superconducting wire having the stacking structure, but the technical spirit of the present invention is also applicable to superconducting wires having other forms as a matter of course.

Figure 2A:
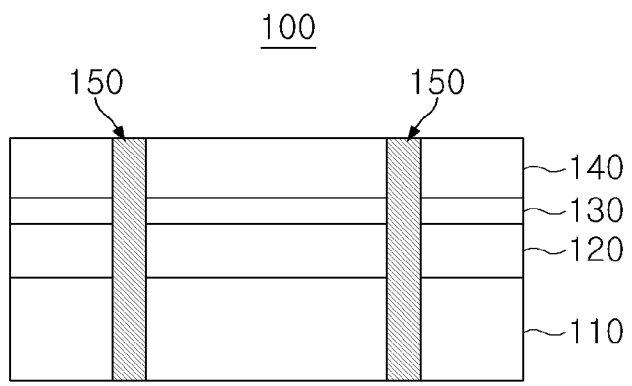
FIGS. 2A and 2B are diagrams schematically illustrating cross-sections of superconducting wires according to first and second exemplary embodiments of the present invention.
Figure 2B:
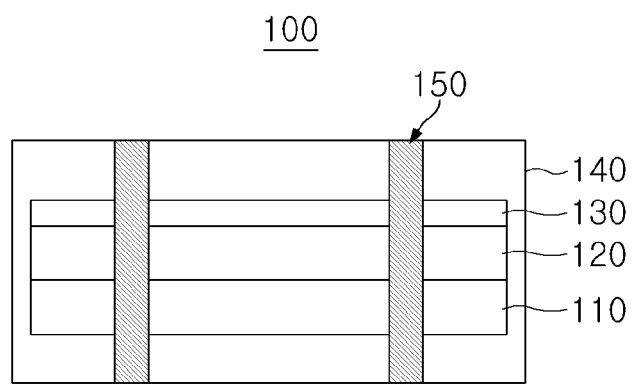

FIGS. 2A and 2B are diagrams schematically illustrating cross-sections of superconducting wires according to exemplary embodiments of the present invention.

FIGS. 2A and 2B illustrate transverse cross-sections of the superconducting wires extended in a longitudinal direction. Referring to FIG. 2A, the superconducting wire has a structure, in which a metal substrate 110, a buffer layer 120, a superconducting layer 130, and a stabilizing layer 140 are sequentially stacked.

As illustrated, the superconducting wire 100 according to the exemplary embodiment of the present invention is formed with a plurality of wedges 150 penetrating through the superconducting layer 130 in a vertical direction to a stacking surface of each layer. It is illustrated that the plurality of wedges 150 penetrates through all of the layers of the superconducting wire, which is, however, just an example of implementation of the present invention and may be variously modified.

The wedge 150 penetrates through the superconducting layer 130 to connect the stabilizing layer 140 and the metal substrate 110. The wedge 150 mechanically, electrically, and/or thermally bonds firmly the stabilizing layer 140 and the metal substrate 110. Further, the wedge 150 may mechanically, electrically, and/or thermally bind firmly each layer configuring the stacking structure with the stabilizing layer 140 and the metal substrate 110.

More particularly, the wedge 150 needs to have a good joining property with the stabilizing layer 140 and the metal substrate 110. For example, materials suitable to weld the stabilizing layer 140 and the metal substrate 110 may be materials forming the wedge of the present exemplary embodiment. Additionally, the wedge may have mechanical strength. For example, the wedge may be formed of a metal, such as silver or copper, having a single composition, or a metal alloy. A material, such as a lead alloy, having strength is also suitable for the wedge of the present invention as a matter of course.

Further, in the present invention, in consideration of extremely-low-temperature operation environment of the superconducting wire, a thermal expansion rate may be a major consideration factor when a candidate material of the wedge is selected. A general metal or metal alloy has a higher thermal expansion rate than that of the superconducting layer, so that the general metal or metal alloy may be a candidate of the material of the wedge of the present invention. For example, when the wedge formed of the metal or the metal alloy is appropriately selected, residual compressive stress may be formed between the metal substrate 110 and the stabilizing layer 140 during cooling.

In the present invention, the wedge may be formed by various methods. For example, after the stacking structure of the superconducting wire is completed, the wedge may be formed by a general recess processing method and a general deposition method. In contrast, after a part of the stacking structure of the wire is formed, a recess processing method and a deposition method may also be employed. As the recess processing method, a processing method, such as laser punching, may be employed. As the deposition method, various deposition methods, such as electroplating, electroless plating, physical vapor deposition, and chemical vapor deposition, may be employed.

FIG. 2B is a diagram schematically illustrating a cross-section structure of a superconducting wire according to a second exemplary embodiment of the present invention.

In FIG. 2B, a stabilizing layer 140 is extended from an upper portion of a superconducting layer to a lower portion of a metal substrate to surround the entirety of the superconducting wire. In this case, a wedge 150 may be designed to penetrate through up to the low stabilizing layer.

FIG. 3 are diagrams schematically illustrating cross-section structure of a superconducting wire according to a third exemplary embodiments of the present invention.

Figure 3A:
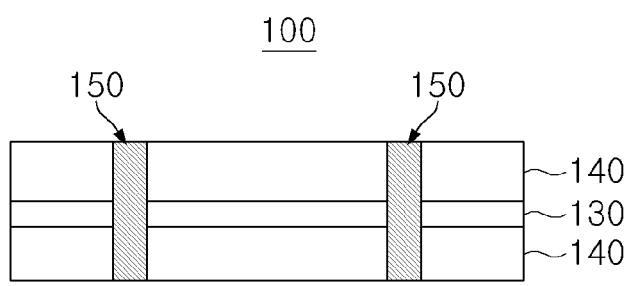
FIGS. 3A and 3B are diagrams schematically illustrating cross-section structure of a superconducting wire according to a third exemplary embodiment of the present invention.

First, referring to FIG. 3A, a region around a superconducting layer 130 is covered with a stabilizing layer 140. In this case, a wedge 150 penetrates through the superconducting layer 130 to connect the stabilizing layers 140. The superconducting wire 100 of the present exemplary embodiment is applicable to the case where a metal substrate and a buffer layer are removed from the superconducting layer.

Figure 3B:
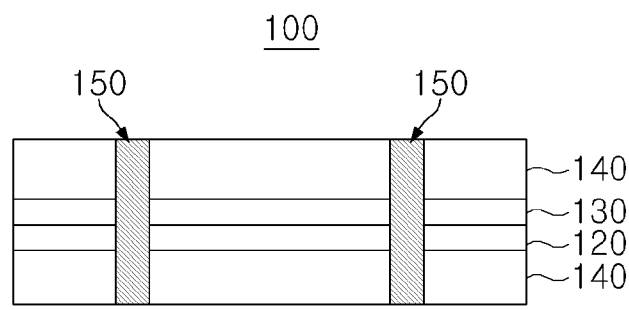

In the meantime, FIG. 3B illustrates a superconducting wire in which a metal substrate is not present as a modification example of the third exemplary embodiment. Even in this case, the plurality of wedges 150 penetrates through a buffer layer 120 and a superconducting layer 130 to connect upper and lower stabilizing layers 140.

MODE FOR CARRYING OUT THE INVENTION

Figure 4:
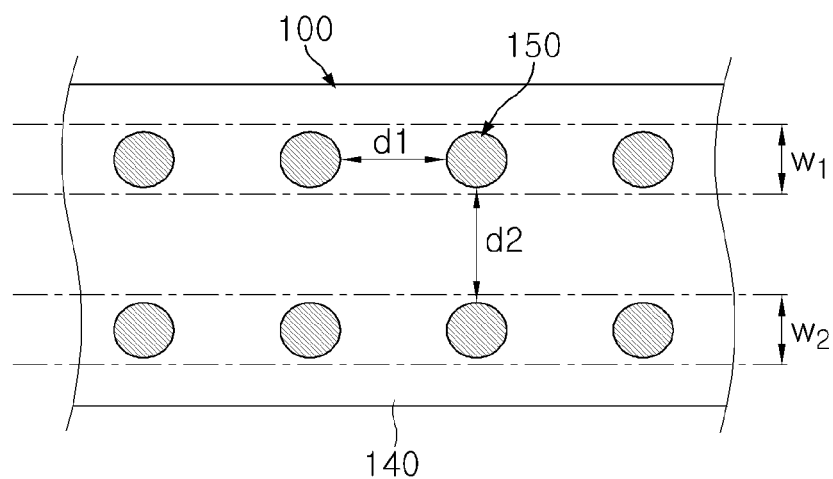
FIG. 4 is a top plan view illustrating a superconducting wire according to an exemplary embodiment of the present invention.
Figure 5A:
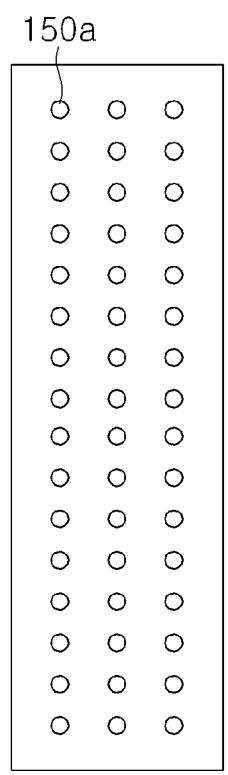
FIGS. 5A to 5D are diagrams illustrating examples of planes of superconducting wires according to various exemplary embodiments of the present invention.
Figure 5B:
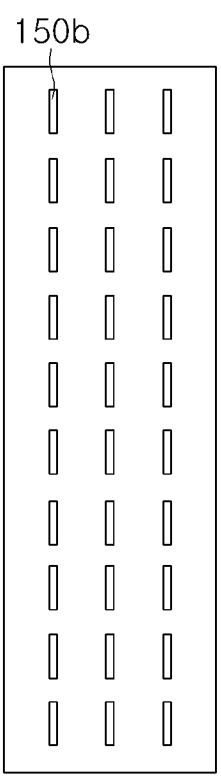
Figure 5C:
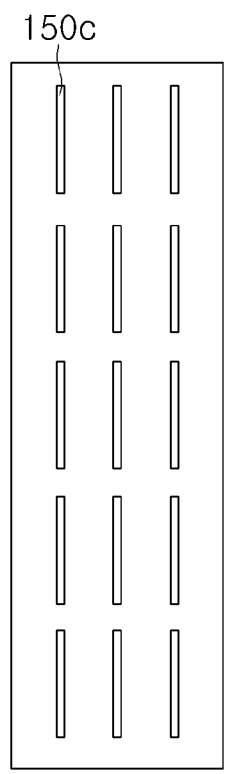
Figure 5D:
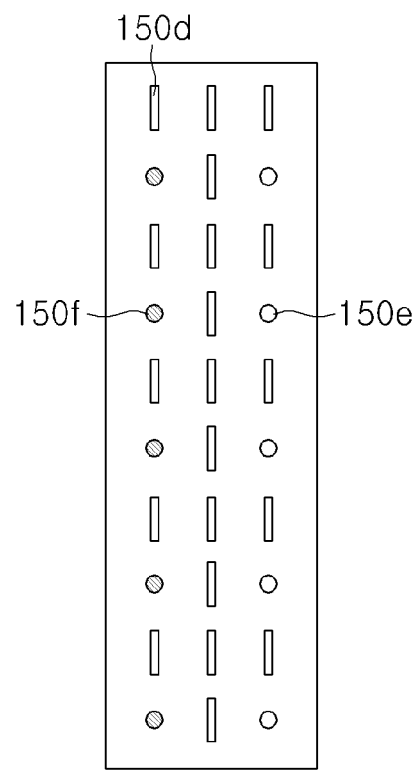

FIG. 4 is a top plan view illustrating a superconducting wire according to an exemplary embodiment of the present invention.

The illustrated superconducting wire 100 has the form of a long strip extended in a longitudinal direction. A plurality of wedges 150 is arranged in the longitudinal direction of the superconducting wire 100.

The plurality of wedges has an appropriate interval and is arranged in the longitudinal direction while being in a row. The plurality of wedges may also be arranged in two rows or more. In the present exemplary embodiment, one row forming the plurality of wedges may have widths w1 and w2 having a predetermined tolerance. In contrast, the plurality of wedges may also be randomly arranged as a matter of course.

Further, the plurality of wedges may also be arranged so as to have intervals d1 and d2 having a predetermined tolerance therebetween.

FIGS. 5A to 5D are diagrams illustrating examples of planes of superconducting wires according to various exemplary embodiments of the present invention.

As illustrated, when viewed in a plane, a wedge pattern may have various cross-section shapes and cross-section areas. The cross-section pattern of the wedge may be a circular pattern 150a, long quadrangular patterns 150b and 150c, and combination patterns 150e and 150f thereof.

Further, each wedge pattern may be configured with a combination of different materials, as well as different cross-section shapes. In the drawing, different hatching patterns indicate different materials. For example, the wedge of the circular pattern may be formed of a solder material, and the wedge of the quadrangular pattern may also be formed of a magnetic material. Further, the different patterns may have different electromagnetic characteristics and mechanical characteristics. Those skilled in the art will appreciate well that in addition to the foregoing example, various shapes and materials may be combined.

Further, the plurality of wedges arranged in the longitudinal direction of the wire shows an effect shown when the superconducting layer is formed of a multi-filament, so that it is possible to obtain effects in that AC loss is decreased and a decrease in a magnetic field due to a screen current is decreased when a superconducting coil is manufactured.

Figure 6:
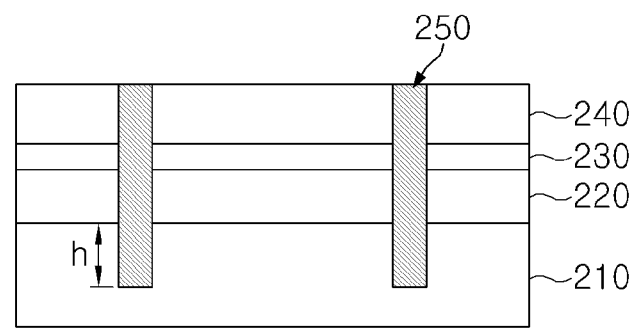
FIG. 6 is a diagram schematically illustrating a cross-section of a superconducting wire according to a fourth exemplary embodiment of the present invention.

FIG. 6 is a diagram schematically illustrating a cross-section of a superconducting wire according to a fourth exemplary embodiment of the present invention.

Referring to FIG. 6, similar to the first exemplary embodiment, a plurality of wedges penetrates through a superconducting layer 230. In the present exemplary embodiment, the plurality of wedges 250 is extended up to a part of a metal substrate. In the present exemplary embodiment, a depth h of the metal substrate to which the wedge is extended may be appropriately selected in consideration of mechanical strength and the like of the wire. In the present exemplary embodiment, the plurality of wedges 250 has an advantage in a process caused by the fact that the plurality of wedges 250 does not need to penetrate through the thick metal substrate.

Figure 7A:
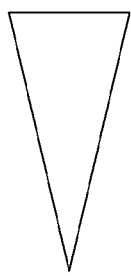
FIG. 7A to 7C are diagrams illustrating examples of a shape of a wedge according to an exemplary embodiments of the present invention.
Figure 7B:
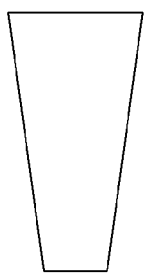
Figure 7C:
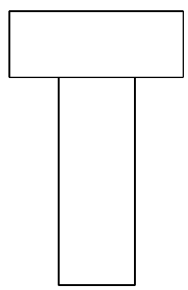

FIG. 7 are diagrams illustrating examples of a shape of a wedge according to exemplary embodiments of the present invention. As illustrated in the drawing, the wedge may have various shapes, such as a V-shape, a quadrangle, and a bolt shape.

Figure 8:
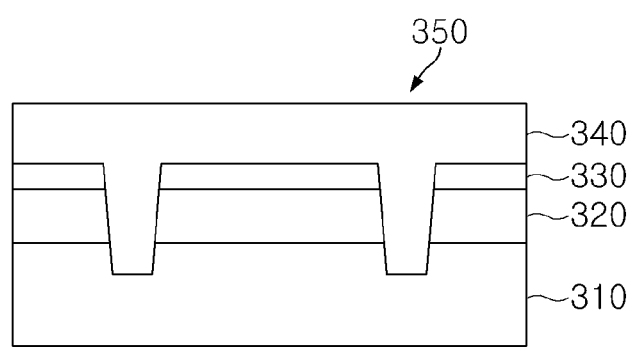
FIG. 8 is a diagram schematically illustrating a cross-section of a superconducting wire according to a fifth exemplary embodiment of the present invention.

FIG. 8 is a diagram schematically illustrating a cross-section of a superconducting wire according to a fifth exemplary embodiment of the present invention.

Referring to FIG. 8, in the present exemplary embodiment, a wedge 350 is extended from a metal layer 340 in an outer portion of the wire, such as a stabilizing layer, in a down direction, and sequentially penetrates through a superconducting layer 330 and a buffer layer 320.

In this case, the wedge 350 may be integrally formed with the outer metal layer 340 by using the same material as that of the outer metal layer 340 or may be formed of a different material from that of the outer metal layer 340. The present exemplary embodiment has an advantage in that recess processing is available before the stabilizing layer is formed. Further, the present exemplary embodiment has an advantage in that it is possible to simultaneously form the stabilizing layer and the wedges.

Figure 9:
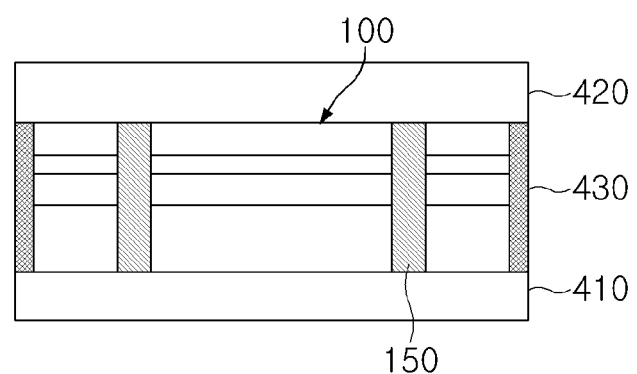
FIG. 9 is a diagram schematically illustrating a cross-section of a superconducting wire according to a sixth exemplary embodiment of the present invention.

FIG. 9 is a diagram schematically illustrating a cross-section of a superconducting wire according to a sixth exemplary embodiment of the present invention.

Referring to FIG. 9, lamination substrates 410 and 420 are attached onto upper and lower surfaces of the superconducting wire 100 including the plurality of wedges described with reference to FIG. 1. The lamination substrates 410 and 420 are firmly fixed to the outer metal layers of the superconducting wire 100, for example, the metal substrate and the stabilizing layer. Additionally, the lamination substrates 410 and 420 may be firmly bound by a solder 430. The foregoing structure may additionally supplement mechanical strength of the superconducting wire.

Figure 10:
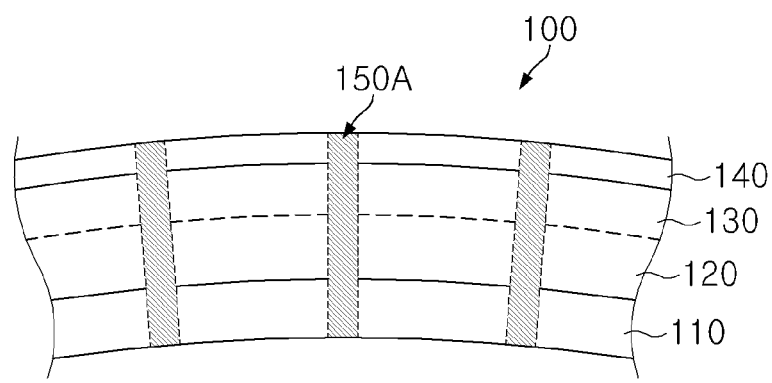
FIGS. 10 and 11 are diagrams for schematically describing operation principles according to exemplary embodiments of the present invention.
Figure 11:
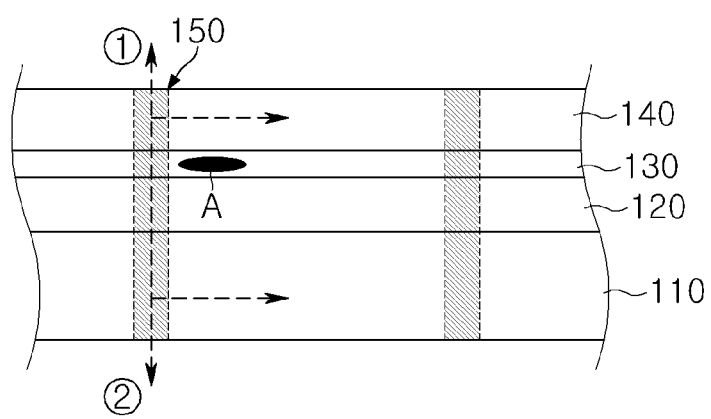

FIGS. 10 and 11 are diagrams for schematically describing operation principles according to exemplary embodiments of the present invention.

As illustrated in FIG. 10, stress is generated in the superconducting wire by bending during an operation, such as coil winding. The respective layers 110, 120, 130, and 140 configuring the superconducting wire have different bonding strength. For example, the buffer layer 120 and the superconducting layer 130 have low binding strength, and may be delaminated by mechanical stress during bending. In the present invention, the plurality of wedges 150 firmly binds the stabilizing layer 140 and the metal substrate 110, thereby supporting the layers of the superconducting wire to prevent the layers from being delaminated. Further, as will be described below, the wedge of the present invention may provide a bypass path for better electric conduction and thermal conduction than that of the related art even when the delamination is generated.

A process in which the wedge of the present invention acts as electric conduction and thermal conduction paths will be described with reference to FIG. 11.

Referring to FIG. 11, when a normal conduction transition state (quench) is generated at a specific point A of a superconducting layer, resistance at the corresponding point locally increases. In this case, the wedge 150 may provide an electric conduction path in a direction vertical to a stacking surface of the superconducting wire. The electric conduction path may be formed in a vertical and upper direction ① and a vertical and low direction ② with respect to the stacking surface of the superconducting wire. The current may bypass via the stabilizing layer 140 in the vertical and upper direction or may bypass to the adjacent superconducting wire. Similarly, the current may bypass via the metal substrate 110 in the vertical and lower direction or may bypass to the adjacent superconducting wire. In the foregoing application, a material of the wedge may have good electric conductivity.

In the meantime, heat generated due to an increase in resistance according to the transition (quench) to the normal conduction state may also be discharged along the illustrated paths ① and ②. A metal material generally has good electric conductivity and thermal conductivity, so that the metal material is usable as a material of the wedge of the present invention.

In the meantime, the structure of the superconducting wire of the present invention may be modified so as to provide a better magnetic path than that of the related art.

Figure 12:
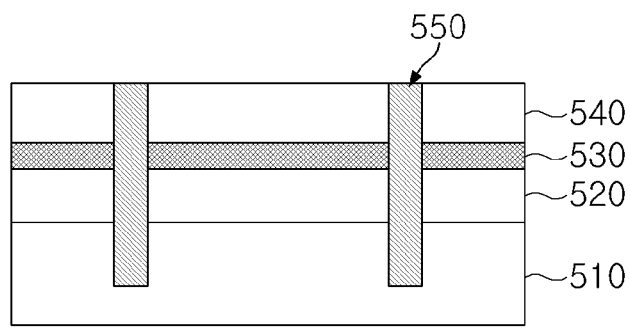
FIG. 12 is a diagram illustrating a cross-section of a superconducting wire as a modification example of the present invention.

FIG. 12 is a diagram illustrating a cross-section of a superconducting wire according to another exemplary embodiment of the present invention.

Referring to FIG. 12, a plurality of wedges 550 formed of a magnetic substance is connected with a metal substrate 510 while penetrating through a superconducting layer 530 and a buffer layer 520.

For example, the wedge 550 may be formed of a ferromagnetic substance, such as Fe or an Fe alloy. In this case, a magnetic flux applied to the superconducting wire in a superconducting state may pass through the wedge 550. Accordingly, in the superconducting wire according to the present exemplary embodiment, the superconducting layer in the superconducting state experiences a relatively low magnetic field. Accordingly, the superconducting wire may have a relatively high critical temperature current in a magnetic field environment.

The exemplary embodiments of the present invention have been described with reference to the accompanying drawings, but those skilled in the art will understand that the present invention may be implemented in another specific form without changing the technical spirit or an essential feature thereof. Thus, it is to be appreciated that the embodiments described above are intended to be illustrative in every sense, and not restrictive.

INDUSTRIAL APPLICABILITY

The present invention is applicable to application of a high magnetic field, such as a superconducting wire and a superconducting magnet.

The invention claimed is:

1. A superconducting wire in which a metal substrate, a buffer layer, a superconducting layer, and a stabilizing layer are stacked, the superconducting wire comprising:
   a plurality of wedges which penetrates through the superconducting layer and the buffer layer to connect the stabilizing layer and the metal substrate by plating or soldering,
   wherein the plurality of wedges mechanically and electrically connect the stabilizing layer and the metal substrate, and the plurality of wedges comprises a plurality of wedge patterns configured with a combination of different materials as well as different cross-section shapes.

2. The superconducting wire of claim 1, wherein the plurality of wedges is arranged in a longitudinal direction of the superconducting wire in a row.

3. The superconducting wire of claim 1, wherein the plurality of wedges is arranged in a longitudinal direction of the superconducting wire in at least two rows.

4. The superconducting wire of claim 1, wherein the plurality of wedges thermally connects the superconducting layer with the metal substrate or the stabilizing layer.

5. The superconducting wire of claim 1, wherein at least some of the plurality of wedges further include a magnetic substance.

6. The superconducting wire of claim 1, wherein at least some of the plurality of wedges penetrate through the metal substrate.

7. The superconducting wire of claim 1, wherein at least some of the plurality of wedges penetrate through the stabilizing layer.

8. The superconducting wire of claim 1, wherein a lamination substrate is stacked on any one of the metal substrate and the stabilizing layer.

* * * * *